United States Patent
Lavoie et al.

(10) Patent No.: US 9,735,268 B2
(45) Date of Patent: Aug. 15, 2017

(54) METHOD FOR FORMING METAL SEMICONDUCTOR ALLOYS IN CONTACT HOLES AND TRENCHES

(71) Applicant: International Business Machines Corporation, Armonk, NY (US)

(72) Inventors: Christian Lavoie, Ossining, NY (US); Zhengwen Li, Danbury, CT (US); Ahmet S. Ozcan, Pleasantville, NY (US); Filippos Papadatos, Austin, TX (US); Chengwen Pei, Danbury, CT (US); Jian Yu, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/228,170

(22) Filed: Aug. 4, 2016

(65) Prior Publication Data

US 2016/0343664 A1 Nov. 24, 2016

Related U.S. Application Data

(62) Division of application No. 14/483,923, filed on Sep. 11, 2014, now Pat. No. 9,425,309, which is a division
(Continued)

(51) Int. Cl.
*H01L 29/45* (2006.01)
*H01L 29/66* (2006.01)
(Continued)

(52) U.S. Cl.
CPC ...... *H01L 29/7833* (2013.01); *H01L 21/0217* (2013.01); *H01L 21/02211* (2013.01);
(Continued)

(58) Field of Classification Search
CPC .......................... H01L 29/4975; H01L 29/665
See application file for complete search history.

(56) References Cited

U.S. PATENT DOCUMENTS

| 5,270,254 A | 12/1993 | Chen et al. |
| 6,175,155 B1 | 1/2001 | Hill |
| (Continued) | | |

OTHER PUBLICATIONS

Office Action dated Mar. 28, 2016 received in U.S. Appl. No. 14/524,650.

*Primary Examiner* — Raj R Gupta
(74) *Attorney, Agent, or Firm* — Scully, Scott, Murphy & Presser, P.C.; Steven J. Meyers

(57) ABSTRACT

A semiconductor device is provided that includes a gate structure on a channel region of a substrate. A source region and a drain region are present on opposing sides of the channel region. A first metal semiconductor alloy is present on an upper surface of at least one of the source and drain regions. The first metal semiconductor alloy extends to a sidewall of the gate structure. A dielectric layer is present over the gate structure and the first metal semiconductor alloy. An opening is present through the dielectric layer to a portion of the first metal semiconductor alloy that is separated from the gate structure. A second metal semiconductor alloy is present in the opening, is in direct contact with the first metal semiconductor alloy, and has an upper surface that is vertically offset and is located above the upper surface of the first metal semiconductor alloy.

19 Claims, 3 Drawing Sheets

Related U.S. Application Data of application No. 13/013,081, filed on Jan. 25, 2011, now Pat. No. 9,006,801.

(51) Int. Cl.

| | |
|---|---|
| *H01L 29/78* | (2006.01) |
| *H01L 21/02* | (2006.01) |
| *H01L 21/285* | (2006.01) |
| *H01L 21/311* | (2006.01) |
| *H01L 21/768* | (2006.01) |
| *H01L 29/49* | (2006.01) |
| *H01L 21/3205* | (2006.01) |
| *H01L 21/321* | (2006.01) |
| *H01L 21/3213* | (2006.01) |
| *H01L 23/535* | (2006.01) |
| *H01L 29/10* | (2006.01) |

(52) U.S. Cl.
CPC .. *H01L 21/02274* (2013.01); *H01L 21/28518* (2013.01); *H01L 21/31116* (2013.01); *H01L 21/321* (2013.01); *H01L 21/32053* (2013.01); *H01L 21/32133* (2013.01); *H01L 21/76802* (2013.01); *H01L 21/76805* (2013.01); *H01L 21/76829* (2013.01); *H01L 23/535* (2013.01); *H01L 29/1054* (2013.01); *H01L 29/45* (2013.01); *H01L 29/456* (2013.01); *H01L 29/458* (2013.01); *H01L 29/4975* (2013.01); *H01L 29/665* (2013.01); *H01L 29/6659* (2013.01); *H01L 29/66545* (2013.01); *H01L 29/7843* (2013.01); *H01L 29/7845* (2013.01); *H01L 29/7849* (2013.01)

(56) References Cited

U.S. PATENT DOCUMENTS

| | | | |
|---|---|---|---|
| 6,696,222 | B2 | 2/2004 | Hsue et al. |
| 7,052,621 | B2 | 5/2006 | Kumar et al. |
| 7,241,681 | B2 | 7/2007 | Kumar et al. |
| 2003/0219971 | A1 | 11/2003 | Cabral, Jr. et al. |
| 2004/0132236 | A1 | 7/2004 | Doris et al. |
| 2006/0267087 | A1* | 11/2006 | Chiu ................ H01L 21/28518 257/335 |
| 2009/0280645 | A1 | 11/2009 | Lee et al. |
| 2010/0178764 | A1 | 7/2010 | Narita et al. |
| 2010/0200928 | A1* | 8/2010 | Ichinose .......... H01L 21/02063 257/369 |
| 2011/0212590 | A1 | 9/2011 | Wu et al. |

\* cited by examiner

METHOD FOR FORMING METAL SEMICONDUCTOR ALLOYS IN CONTACT HOLES AND TRENCHES

BACKGROUND

The present disclosure relates generally to the field of semiconductor device processing techniques, such as the formation of metal semiconductor alloys, which are typically referred to as metal silicides.

Metal silicide formation typically requires depositing a metal such as Ni, Co, Pd, Pt, Rh, Ir, Zr, Cr, Hr, Er, Mo or Ti onto a surface of a silicon-containing material or wafer. Following deposition, the structure is subjected to an annealing step using conventional processes such as, but not limited to, rapid thermal annealing. During thermal annealing, the deposited metal reacts with silicon to form a metal silicide. In some instances, upper portions of the metal do not reacted during the anneal, and may thus be selectively removed with respect to the reacted silicide.

SUMMARY

A method of forming a semiconductor device is provided in which metal semiconductor alloy contacts are formed that include at least two metal semiconductor alloys. In one embodiment, the method includes forming a first metal semiconductor alloy on a semiconductor containing surface, and forming a dielectric layer over the first metal semiconductor alloy. Openings are formed in the dielectric layer to provide an exposed surface of the first metal semiconductor alloy. A second metal semiconductor alloy is formed on the exposed surface of the first metal semiconductor alloy.

In another embodiment, a method of forming a semiconductor device is provided that includes forming a gate structure on a channel region of a substrate, wherein a source region and a drain region are present on opposing sides of the channel region. A dielectric layer is formed over at least one of the source region, the drain region and the gate structure. An opening is formed in the dielectric layer to provide an exposed semiconductor-containing surface of at least one of the source region, the drain region and the gate structure. A first metal semiconductor alloy is formed on the exposed semiconductor-containing surface. A second metal semiconductor alloy is formed on the first metal semiconductor alloy.

In another aspect, the present disclosure provides a semiconductor device including contacts to the source and drain regions of the semiconductor device comprising at least two metal semiconductor alloys. In one embodiment, the semiconductor device includes a gate structure on a channel region of a substrate, wherein a source region and a drain region are present on opposing sides of the channel region of the substrate. A first metal semiconductor alloy is present on an upper surface of at least one of the source region and the drain region. The first metal semiconductor alloy extends to a sidewall of the gate structure. A dielectric layer is present over the gate structure and the first metal semiconductor alloy. An opening is present through the dielectric layer to a portion of the first metal semiconductor alloy that is separated from the gate structure. A second metal semiconductor alloy is present in the opening and is in direct contact with the first metal semiconductor alloy. The second metal semiconductor alloy has an upper surface that is vertically offset and is located above the upper surface of the first metal semiconductor alloy.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
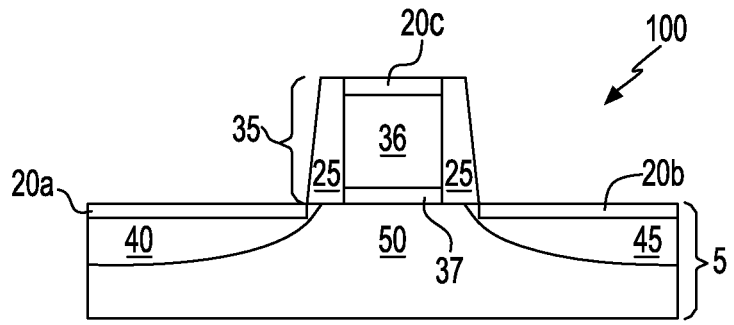
FIG. 1 is a side cross-sectional view of one embodiment of a semiconductor device that includes a first metal semiconductor alloy that is present on at least the source and drain regions of the semiconductor device, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to metal semiconductor alloys. A "metal semiconductor alloy" is an alloy of a metal and a semiconductor. An alloy is homogeneous mixture or solid solution, in which the atoms of the metal replace or occupy interstitial positions between the atoms of the semiconductor. Contacts composed of metal semiconductor alloy may be formed to semiconductor devices, such as field effect transistors (FETs). A field effect transistor (FET) is a semiconductor device in which output current, i.e., source-drain current, is controlled by the voltage applied to a gate structure. A field effect transistor (FET) has three terminals, i.e., a gate structure, a source and a drain region.

When forming semiconductor devices, such as field effect transistors, using replacement gate methods, the interconnect to the metal semiconductor alloy contacts of the source and drain regions of the semiconductor device are typically formed in trenches, i.e., openings to the source and drain region, that extend through a dielectric layer, such as an interlevel dielectric layer. Typically, the metal semiconductor alloy that provides the contact to the source and drain region is formed prior to the dielectric layer. The dielectric layer is formed over the source and drain regions including the metal semiconductor alloy portions, and openings are formed through the dielectric layer to expose a portion of the metal semiconductor alloy in which the subsequently formed interconnects will contact. The etch that forms the openings for the interconnects in the dielectric layer typically thins the metal semiconductor alloy that is present on the upper surface of the source and drain regions. By thinning the metal semiconductor alloy, the etch process that forms the openings for the interconnects in the dielectric layer produces a high resistance in the metal semiconductor alloy region of the source region and the drain region.

In some embodiments, the present disclosure provides a method that increases the thickness of the first metal semiconductor alloy regions that have been thinned through etch processing by depositing a second metal semiconductor alloy on the etched portions of the first metal semiconductor alloy. FIGS. 1-4 depict one embodiment of the present disclosure that forms a semiconductor device 100 including a second metal semiconductor alloy 65a, 65b, 65c on a portion of a first metal semiconductor alloy 20a, 20b, 20c that is formed prior to dielectric layer 10 that provides the openings for interconnects 55, in which the first metal semiconductor alloy 20a, 20b, 20c is present on the upper surface of at least one of source region 40, drain region 45 and gate conductor 36 of gate structure 35.

FIG. 1 depicts one embodiment of a semiconductor device 100 that includes first metal semiconductor alloy contacts 20a, 20b, 20c that are present on the upper surface of the source region 40, drain region 45 and the upper surface of the gate conductor 36 of the gate structure 35. In one embodiment, the first metal semiconductor alloy contacts 20a, 20b that are present on the source region 40 and drain region 45 extend along an entire upper surface of the source region 40 and the drain region 45, in which the first metal semiconductor alloy contacts 20a, 20b are in direct contact with the at least one dielectric sidewall spacer 25 of the gate structure 35. The semiconductor device 100 depicted in FIG. 1 may be a field effect transistor (FET). A field effect transistor (FET) is a semiconductor device in which output current, i.e., source-drain current, is controlled by the voltage applied to a gate structure 35. The gate structure 35 is a structure used to control output current, i.e., flow of carriers in the channel region 50, of a semiconducting device 100, such as a field effect transistor, through electrical or magnetic fields. The gate structure 35 typically includes at least one gate conductor 36, at least one gate dielectric 37 and at least one dielectric spacer 25. The channel region 50 is the region between the source region 40 and the drain region 45 of a field effect transistor (FET) that becomes conductive when the semiconductor device 100 is turned on. The source region 40 is a doped region in the transistor, in which majority carriers are flowing into the channel 50. The drain region 45 is the doped region in transistor located at the end of the channel 50, in which carriers are flowing out of the semiconductor device 100 through the drain region 45. Although the semiconductor device 100 that is depicted in FIG. 1 is a field effect transistor (FET), the present disclosure is suitable for any semiconductor device including complementary metal oxide semiconductor (CMOS) devices, bipolar junction transistor (BJT) semiconductor devices, schottky barrier semiconductor devices, and finFET semiconductor devices.

The substrate 5 (also referred to as a "semiconductor substrate 5") may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. In one embodiment, the substrate 5 is composed of a single crystal material, such as single crystal silicon. As used herein, the term "single crystal" denotes a crystalline solid, in which the crystal lattice of the entire sample is substantially continuous and substantially unbroken to the edges of the sample, with substantially no grain boundaries.

Still referring to FIG. 1, the gate structure 35 may include at least a gate conductor 36 atop a gate dielectric 37. The gate dielectric 37 and the gate conductor 36 of the gate structure 35 are present over the channel region 50 of the substrate 5. The gate conductor 36 may be a metal gate electrode. The gate conductor 36 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. In one example, the gate conductor 36 is composed of TiN, TaN, Al, W or a combination thereof. In another embodiment, the gate conductor 36 may also be composed of a doped semiconductor material, such as n-type doped polysilicon.

Although not depicted in FIG. 1, the gate conductor 36 may be a multi-layered structure. For example, the gate conductor 36 may include a second conductive material atop a metal gate electrode. In one example, the second conductive material may be a doped semiconductor material, such as a doped silicon containing material, e.g., n-type doped polysilicon. When a combination of conductive elements is employed, an optional diffusion barrier material such as TaN or WN may be formed between the conductive materials.

The gate conductor 36 of the gate structure 35 is typically present on a gate dielectric 37. The gate dielectric 37 may be a dielectric material, such as $SiO_2$, or alternatively a high-k dielectric, such as oxides of Hf, Ta, Zr, Al or combinations thereof. In another embodiment, the gate dielectric 37 is comprised of an oxide, such as $ZrO_2$, $Ta_2O_5$ or $Al_2O_3$. In one embodiment, the gate dielectric 37 has a thickness ranging from 1 nm to 10 nm. In another embodiment, the gate dielectric 37 has a thickness ranging from 1.0 nm to 2.0 nm.

At least one dielectric spacer 25 may be in direct contact with the sidewalls of the gate structure 35. The at least one dielectric spacer 25 typically has a width ranging from 2.0 nm to 15.0 nm, as measured from the sidewall of the gate structure 35. The at least one dielectric spacer 25 may be composed of a dielectric, such as a nitride, oxide, oxynitride, or a combination thereof. In one example, the at least one dielectric spacer 25 is composed of silicon nitride ($Si_3N_4$). In one embodiment, the at least one dielectric spacer 25 may be formed by using a blanket layer deposition, such as chemical vapor deposition, and anisotropic etchback method.

A source region 40 and a drain region 45 may be on opposing sides of the Channel region 50. The conductivity-type of the source region 40 and the drain region 45 determines the conductivity of the semiconductor device 100. Conductivity-type denotes whether the source region 40 and the drain region 45 have been doped with a p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

In one embodiment, the source region 40 and the drain region 45 are formed using an ion implantation process. Each of the source region 40 and the drain region 45 may include an extension dopant region and a deep dopant region (not shown). When forming a p-type extension region portion of the source region 40 and the drain region 45, a typical dopant species is boron or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. A typical implant for the n-type extension dopant region of the source region 40 and the drain region 45 is arsenic. The n-type extension dopant region of the source region 40 and the drain region 45 can be implanted with arsenic using implant energies ranging from 1.0 keV to 10.0 keV with a dose ranging from $5 \times 10^{14}$ atoms/cm$^2$ to $5 \times 10^{15}$ atoms/cm$^2$.

Typically, the dopant concentration of the extension dopant region having p-type dopant ranges from $5 \times 10^{19}$ atoms/cm$^3$ to $5 \times 10^{20}$ atoms/cm$^3$. In another embodiment, the extension dopant region having p-type dopant ranges from $7 \times 10^{19}$ atoms/cm$^3$ to $2 \times 10^{20}$ atoms/cm$^3$. Typically, the dopant concentration of the extension dopant region having n-type conductivity ranges from $5 \times 10^{19}$ atoms/cm$^3$ to $5 \times 10^{20}$ atoms/cm$^3$. In another embodiment, the extension dopant region having n-type conductivity ranges from $7 \times 10^{19}$ atoms/cm$^3$ to $2 \times 10^{20}$ atoms/cm$^3$. The deep dopant regions typically have the same conductivity dopant that may be present in greater concentration at greater depths into the semiconductor substrate 5 than the extension dopant region. In some embodiments, the dopant may be introduced into the substrate 5 by ion implantation. The dopant may also be introduced to the substrate 5 in situ to provide the source region 40 and the drain region 45. In situ means that the dopant is introduced during the process sequence that forms the material layers that provide the substrate 5.

The first metal semiconductor alloy 20a, 20b, 20c may be formed atop semiconductor containing surfaces, such as the source region 40, drain region 45 or the gate conductor 36 of the gate structure 35, wherein the first metal semiconductor alloy 20a, 20b, 20c is composed of a silicide or germano-silicide. In one example, the first metal semiconductor alloy contact 20 may be composed of nickel silicide ($NiSi_x$). Other examples of compositions for the first metal semiconductor alloy 20a, 20b, 20c may include, tungsten silicide ($WSi_x$), nickel silicide (NiSi), nickel platinum silicide ($NiPt_ySi_x$), platinum silicide (PtSi), cobalt silicide ($CoSi_x$), tantalum silicide ($TaSi_x$), titanium silicide ($TiSi_x$) and combinations thereof. In one example, in which the first metal semiconductor alloy 20a, 20b, 20c is composed of nickel silicide (NiSi), the silicon content may range from 40 wt. % to 60 wt. %, and the Ni content ranges from 40 wt. % to 60 wt. %.

Formation of the first metal semiconductor alloy 20a, 20b, 20c, e.g., first silicide, typically requires depositing a first metal layer (not shown) onto the surface of a Si-containing material, e.g., silicon containing source region 40, drain region 45, and/or gate conductor 36. The first metal layer may be formed using a physical vapor deposition (PVD) process, such as plating, e.g., electroplating or electroless deposition, or sputtering. In one example, the first metal layer is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the first metal layer include DC diode type systems, radio frequency (RF) sputtering, magnetron sputtering, and ionized metal plasma (IMP) sputtering. The first metal layer may also be deposited using chemical vapor deposition (CVD) or atomic layer deposition (ALD). In one embodiment, metal is deposited onto the upper surface of the source and drain regions 40, 45 to form a first metal layer with a thickness from 2 nm to 10 nm. In another embodiment, the first metal layer is deposited to a thickness ranging from 2 nm to 5 nm. Metal is also deposited atop the gate conductor 36 and forms a gate metal semiconductor alloy region 20c.

The first metal layer that is deposited for first metal semiconductor alloy 20a, 20b, 20c formation may include Ta, Ti, W, Pt, Co, Ni, and combinations thereof. In one embodiment, following deposition, the structure is subjected to an annealing step, such as rapid thermal annealing, to convert at least a first portion of the first metal layer and the semiconductor containing surface that the first metal layer is deposited onto to the first metal semiconductor alloy 20a, 20b, 20c. Other forms of annealing suitable for converting the first metal layer and the semiconductor containing surface into the first metal semiconductor alloy 20a, 20b, 20c include furnace annealing and laser annealing. In one embodiment, a thermal annealing is conducted at a temperature ranging from 400° C. to 850° C., for a time period ranging from 1 second to 300 seconds. In another embodiment, a thermal annealing is conducted at a temperature ranging from 400° C. to 850° C., for a time period ranging from 5 seconds to 30 seconds. The anneal process for silicide formation is dependent on the metal utilized. For example, the annealing temperature for forming cobalt monosilicide formation is 500° C., and the annealing temperature for forming cobalt disilicide is 750° C.

By "convert" it meant that at least a portion of the metal elements from the first metal layer and at least a portion of the semiconductor elements from the source region 40, the drain region 45 and/or the gate conductor 36 are intermixed or alloyed. In one embodiment, the intermixing or alloying of the metal elements and the semiconductor elements is provided by thermal diffusion. In one example, during thermal annealing, the deposited first metal layer reacts with the silicon of the semiconductor containing surface forming a metal silicide.

The first metal semiconductor alloy 20a, 20b, 20c may have a thickness of 1 nm to 20 nm. In another embodiment, the first metal semiconductor alloy 20a, 20b, 20c may have a thickness that ranges from 2.0 nm to 15 nm. In yet another embodiment, the first metal semiconductor alloy 20a, 20b, 20c may have a thickness that ranges from 5.0 nm to 12.0 nm. In yet another embodiment, the first metal semiconductor alloy 20a, 20b, 20c has a thickness that ranges from 7.0 nm to 10.0 nm.

The remaining portion of the first metal layer that is not converted into the first metal semiconductor alloy 20a, 20b, 20c may be removed by a selective etch process. In one embodiment, the remaining portion of the first metal layer is removed by an etch that is selective to the first metal semiconductor alloy 20a, 20b, 20c. The etch process may be a wet chemical etch, or a dry etch process, e.g. reactive ion etch (RIE). In one embodiment in which the first metal layer is composed of a nickel platinum alloy (NiPt$_y$) and the first metal semiconductor alloy 20a, 20b, 20c is composed of nickel platinum silicide (NiPt$_y$Si$_x$), the etch process that removes the remaining portion of the first metal layer is a wet etch composed of sulfuric peroxide or Aqua Regia chemistry.

Figure 2:
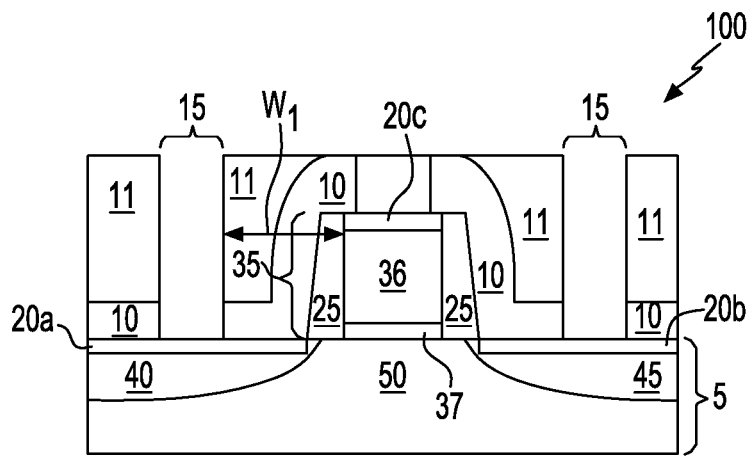
FIG. 2 is side cross-sectional view depicting forming a dielectric layer over the semiconductor device depicted in FIG. 1, in which the dielectric layer includes openings to the source region and the drain region of the semiconductor device to provide an exposed surface the first metal semiconductor alloy, in accordance with one embodiment of the present disclosure.

FIG. 2 depicts one embodiment of forming a dielectric layer 10 over the semiconductor device 100 that is depicted in FIG. 1. In one embodiment, the dielectric layer 10 may be formed over the gate structure 35, the source region 40 and the drain region 45 of the semiconductor device 100. The dielectric layer 10 may be composed of a stress inducing material. The term "stress inducing material" denotes a material having an intrinsic stress, in which the intrinsic stress effectuates a stress in an underlying material. The stress inducing material may be a compressive stress inducing material or a tensile stress inducing material. The term "compressive stress inducing material" denotes a material having an intrinsic compressive stress, in which the intrinsic compressive stress produces a compressive stress in an underlying material. The term "tensile stress inducing material" denotes a material layer having an intrinsic tensile stress, in which the intrinsic tensile stress produces a tensile stress in an underlying material.

In one embodiment, the at least one dielectric layer 10 is a tensile stress inducing material when the semiconductor device 100 is an n-type semiconductor device, such as an n-type field effect transistor (nFET), and the at least one dielectric layer 10 is a compressive stress inducing material when the semiconductor device is a p-type semiconductor device, such as a p-type field effect transistor (pFET).

The dielectric layer 10 that is composed of the tensile stress inducing material or the compressive stress inducing material may be formed using deposition, photolithography and etching. More specifically, in one embodiment, the tensile stress inducing material or the compressive stress inducing material is blanket deposited over the semiconductor device 100. In one embodiment, the dielectric material that is composed of the compressive stress inducing material or the tensile stress inducing material is deposited using a conformal deposition process to provide a conformal layer. The term "conformal layer" denotes a layer having a thickness that does not deviate from greater than or less than 20% of an average value for the thickness of the layer.

Plasma enhanced chemical vapor deposition (PECVD) can form dielectric layer 10 having a compressive or tensile internal stress. The stress state of the stressed dielectric layer deposited by PECVD can be controlled by changing the deposition conditions to alter the reaction rate within the deposition chamber. More specifically, the stress state of the deposited stressed dielectric layer 10 may be set by changing the deposition conditions such as: SiH$_4$/N$_2$/He gas flow rate, pressure, RF power, and electrode gap.

Rapid thermal chemical vapor deposition (RTCVD) can provide stress inducing dielectrics having an internal tensile stress. The magnitude of the internal tensile stress produced within the dielectric layer 10 deposited by RTCVD can be controlled by changing the deposition conditions. More specifically, the magnitude of the tensile stress within the deposited dielectric layer 10 may be set by changing deposition conditions such as: precursor composition, precursor flow rate and temperature.

In one embodiment, a dielectric layer 10 composed of tensile stress inducing material may be formed by plasma enhanced chemical vapor deposition (PECVD) of silicon nitride, in which the deposition conditions include a low frequency power ranging up to 100 W, a high frequency power ranging from 200 W to 600 W, a silane flow rate ranging from 50 sccm to 200 sccm, an NH$_3$ flow rate ranging from 1,500 sccm to 3,000 sccm, and a deposition pressure of 15 Torr or less. The dielectric layer 10 composed of tensile stress inducing material can be deposited to a thickness generally in the range from 300 angstroms to 1500 angstroms. In one embodiment, the dielectric layer 10 composed of tensile stress inducing material has a thickness ranging from 300 angstroms to 1000 angstroms. In one example, the tensile stress provided by the dielectric layer 10 may be greater than 1.5 GPa (giga Pascals).

In one embodiment, a dielectric layer 10 composed of compressive stress inducing material may be formed by plasma enhanced chemical vapor deposition (PECVD) of silicon nitride, in which the deposition conditions include a low frequency power ranging from 500 W to 1,500 W, a high frequency power ranging from 250 W to 500 W, a silane flow rate ranging from 800 sccm to 2,000 sccm, an $NH_3$ flow rate ranging from 6,000 to 10,000 sccm, and a deposition pressure of 10 Torr or less. The dielectric layer 10 composed of compressive stress inducing material can be deposited to a thickness generally in the range of from 300 angstroms to 1500 angstroms. In one embodiment, dielectric layer 10 composed of compressive stress inducing material has a thickness ranging from 300 angstroms to 1000 angstroms. In one example, the compressive stress provided by the dielectric layer 10 may be greater than 3.5 Gpa.

In another embodiment of the disclosure, the dielectric layer 10 is in a substantially neutral stress state. By substantially neutral state it is meant that the intrinsic stress of the conformal dielectric layer is no greater than 100 MPa (mega Pascals). The dielectric layer 10 in the substantially neutral state may be composed of any dielectric layer including, but not limited to, oxides, nitrides, oxynitrides or combinations and multi-layers thereof. The dielectric layer 10 in the substantially neutral stress state may be formed by a deposition method including, but not limited to spinning from solution, spraying from solution, chemical vapor deposition (CVD), plasma enhanced CVD (PECVD), plasma oxidation, plasma nitridation, sputter deposition, reactive sputter deposition, ion-beam deposition, and evaporation. The dielectric layer 10 in the substantially neutral stress state can be deposited to a thickness generally in the range from 300 angstroms to 1500 angstroms.

Referring to FIG. 2, in some embodiments, following the formation of the dielectric layer 10, an interlevel dielectric layer 11 is non-conformally formed over the dielectric layer 10. The interlevel dielectric layer 11 may be selected from the group consisting of silicon-containing materials such as silicon oxide, silicon nitride, $SiO_xN_y$, SiC, SiCO, SiCOH, and SiCH compounds, the above-mentioned silicon-containing materials with some or all of the Si replaced by Ge; carbon-doped oxides; inorganic oxides; inorganic polymers; hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the interlevel dielectric layer 11 include any of the aforementioned materials in porous form, or in a form that changes during processing to or from being porous and/or permeable to being non-porous and/or non-permeable. The interlevel dielectric layer 11 may be formed by various deposition methods, including, but not limited to, spinning from solution, spraying from solution, chemical vapor deposition (CVD), plasma enhanced CVD (PECVD), sputter deposition, reactive sputter deposition, ion-beam deposition, and evaporation.

FIG. 2 depicts one embodiment of removing a portion of the at least one dielectric layer 10 and the interlevel dielectric layer 11 to expose a portion of the upper surface of the first metal semiconductor alloy 20a that is present on the source region 40, the upper surface of the first metal semiconductor alloy 20b that is present on the drain region 45, and optionally an upper surface of the first metal semiconductor alloy 20c that is present on the gate conductor 36. The openings 15 to the first metal semiconductor alloy 20a, 20b, 20c may be vias or trenches having an aspect ratio, i.e., height to width ratio, ranging from 2:1 to 7:1. In another embodiment, the aspect ratio of the openings 15 may range from 2:1 to 4:1. The openings 15 that are overlying the source region 40 and the drain region 45 are typically separated from the gate conductor 36 of the gate structure by a dimension W1 ranging from 10 nm to 40 nm, as measured from the inner sidewall of the opening 15 to the sidewall of the gate conductor 36. In another embodiment, the openings 15 that are overlying the source region 40 and the drain region 45 are typically separated from the gate conductor 36 of the gate structure by a dimension W1 ranging from 15 nm to 25 nm.

Openings 15 may be formed through the interlevel dielectric layer 11 and the dielectric layer 10 to expose the first metal semiconductor alloy 20a, 20b, 20c. The openings 15 may be formed using photolithography and etch processes. For example, a photoresist etch mask can be produced by applying a photoresist layer to the upper surface of the interlevel dielectric layer 11, exposing the photoresist layer to a pattern of radiation, and then developing the pattern into the photoresist layer utilizing a resist developer. The photoresist etch mask may be positioned so that portions of the interlevel dielectric layer 11 and the dielectric layer 10 are not protected by the photoresist etch mask in order to provide the openings 15.

The exposed portions of the interlevel dielectric layer 11 and the dielectric layer 10 are then removed by a selective etch. As used herein, the term "selective" in reference to a material removal process denotes that the rate of material removal for a first material is greater than the rate of material removal for at least another material of the structure to which the material removal process is being applied. The selective etch may be an anisotropic etch or an isotropic etch. One example of an anisotropic etch that is suitable for forming the openings 15 is reactive ion etch (RIE). Other examples of anisotropic etching that can be used at this point of the present disclosure include ion beam etching, plasma etching or laser ablation.

In one embodiment, the openings 15 are first formed in the interlevel dielectric layer 11 with an etch that terminates on the dielectric layer 10. Thereafter, the openings 15 are extended through the dielectric layer 10 to the expose the first metal semiconductor alloy 20a, 20b, 20c. In one example, when the interlevel dielectric layer 11 is composed of silicon oxide or silicon nitride, and the first metal semiconductor alloy 20a, 20b, 20c is composed of nickel platinum silicide ($NiPt_ySi_x$), the etch chemistry for forming the openings 15 to the source region 40 and drain region 45 is composed of fluorine based chemical, such as $CF_4$, $CClF_2$, $SF_6$ and combinations thereof. In one embodiment, the width W1 of the opening 15 to the first semiconductor alloy contact 20a, 20b, 20c on the source region 40 and the drain region 45 ranges from 10 nm to 60 nm. In another embodiment, the width W1 of the openings 15 ranges from 20 nm to 40 nm.

In one embodiment, the etching that forms the opening 15 in the dielectric layer 10 decreases a thickness of the first metal semiconductor alloy 20a, 20b, 20c by 5% to 95% of an original thickness of the first metal semiconductor alloy 20a, 20b, 20c. In another embodiment, the etching that forms the opening 15 in the dielectric layer 10 decreases a thickness of the first metal semiconductor alloy 20a, 20b, 20c by 10% to 90% of an original thickness of the first metal semiconductor alloy 20a, 20b, 20c.

In one embodiment, the etching that forms the opening 15 in the dielectric layer 10 decreases the thickness of the first metal semiconductor alloy 20a, 20b, 20c by 2 nm to 20 nm. In another embodiment, the etching that forms the opening 15 in the dielectric layer 10 decreases the thickness of the first metal semiconductor alloy 20a, 20b, 20c by 5 nm to 15 nm. The remaining portion of the first metal semiconductor alloy 20a, 20b, 20c may have a thickness ranging from 2 nm to 20 nm. In another embodiment, the remaining portion of the first metal semiconductor alloy 20a, 20b, 20c may have a thickness ranging from 5 nm to 10 nm.

Although the gate structure 35 has been described above as a functional gate structure 35 that is formed before the dielectric layer 10, in some embodiments of the present disclosure the gate structure 35 may be formed using a replacement gate process following the formation of at least the dielectric layer 10. In a replacement gate technology, a sacrificial material dictates the geometry and location of the later formed gate structure 35. The sacrificial material is used to form the doped regions of the semiconductor substrate 5, such as the source region 40 and the drain region 45. The sacrificial material is then replaced with the gate structure 35. By employing a sacrificial material, the thermal budget that is applied to the gate structure 35 may be reduced.

The sacrificial gate structure may be composed of any material that can be etched selective to the underlying upper surface of the substrate 5. In one embodiment, the sacrificial gate structure may be composed of a silicon containing material, such as polysilicon. The sacrificial gate structure may be formed using deposition, photolithography and etch processes. The at least one dielectric spacer 25 is then formed adjacent to the sacrificial gate structure, i.e., in direct contact with the sidewall of the sacrificial gate structure. The source region 40 and the drain region 45 may be formed before or after the at least one dielectric spacer 25 depending upon the desired positioning of the source and drain regions 40, 45 in the substrate 5. The dielectric layer 10, and optionally the interlevel dielectric layer 11, may then be deposited over the sacrificial gate structure and the substrate 5. Following deposition, the dielectric layer 10, and optionally the interlevel dielectric layer 11, is planarized until the upper surface of the sacrificial gate structure is exposed.

The sacrificial gate structure is then removed to provide an opening to an exposed portion of the substrate 5 that includes the channel region 50. The sacrificial gate structure is typically removed using a selective etch process that removes the sacrificial gate structure selective to the substrate 5, the dielectric layer 10, and the optional interlevel dielectric layer 11. The functional gate structure 35 may then be formed in the opening to the substrate 5 that is defined by removing the sacraficial gate structure. The functional gate structure 35 may be formed using deposition methods, such as chemical vapor deposition (CVD). The elements of the functional gate structure 35 and their compositions have been described above with reference to FIG. 1.

Figure 3:
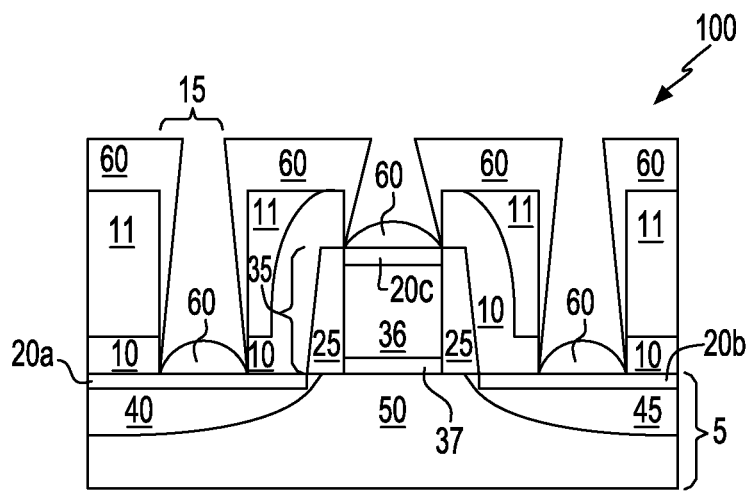
FIG. 3 is a side cross-sectional view depicting depositing a second metal layer on the exposed surface of the first metal semiconductor alloy, in accordance with one embodiment of the present disclosure.

FIG. 3 depicts one embodiment of depositing a second metal layer 60 on the exposed surface of the first metal semiconductor alloy 20a, 20b, 20c. In one embodiment, the second metal layer 60 is deposited on the exposed upper surface of the first metal semiconductor alloy 20a, 20b, 20c, at least a portion of the sidewalls of the openings 15 leading to the first metal semiconductor alloy 20a, 20b, 20c, and an upper surface of the interlevel dielectric layer 11 that is present between the openings leading to the first metal semiconductor alloy 20a, 20b, 20c.

The second metal layer 60 may be formed using a physical vapor deposition (PVD) process, such as plating, e.g., electroplating or electroless deposition, or sputtering. In one example, the second metal layer 60 is deposited using sputtering. Examples of sputtering apparatus that may be suitable for depositing the second metal layer 60 include DC diode type systems, radio frequency (RF) sputtering, magnetron sputtering, and ionized metal plasma (IMP) sputtering. In one embodiment, the second metal layer 60 is deposited to a thickness ranging from 2 nm to 10 nm. In another embodiment, the second metal layer 60 is deposited to a thickness ranging from 2 nm to 5 nm. The thickness of the second metal layer 60 may be selected to fill the void in the first metal semiconductor alloy 20a, 20b, 20c that is formed by the etch process that produces the openings 15 to the first metal semiconductor alloy 20a that is on the source region 40, the first metal semiconductor alloy 20b that is on the drain region 45, and the first metal semiconductor alloy 20c that is present on the gate conductor 36 of the gate structure 35.

The second metal layer 60 that is deposited for second metal semiconductor alloy 65a, 65b, 65c formation may include Ta, Ti, W, Pt, Co, Ni, and combinations thereof. In one embodiment, the composition of the second metal layer 60 is selected to provide a second metal semiconductor alloy 65a, 65b, 65c having the same composition as the first metal semiconductor alloy 20a, 20b, 20c. In another embodiment, the composition of the second metal layer 60 is selected to provide a second metal semiconductor alloy 65a, 65b, 65c having a different composition as the first metal semiconductor alloy 20a, 20b, 20c.

Figure 4:
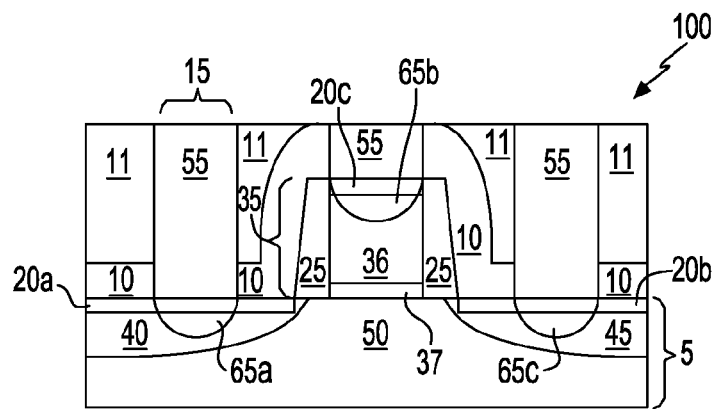
FIG. 4 is a side cross-sectional view depicting converting at least a portion of the second metal layer and the first metal semiconductor alloy into a second metal semiconductor alloy, in accordance with one embodiment of the present disclosure.

In one embodiment, following deposition of the second metal layer 60, the structure is subjected to an annealing step, such as rapid thermal annealing, to convert at least a portion of the second metal layer 60 and the upper surface of the first metal semiconductor alloy 20a, 20b, 20c that is in direct contact with the second metal layer 60 into a second metal semiconductor alloy 65a, 65b, 65c, as depicted in FIG. 4. Other forms of annealing suitable for converting the second metal layer 60 and the upper surface of the first metal semiconductor alloy 20a, 20b, 20c into the second metal semiconductor alloy 65a, 65b, 65c include furnace annealing and laser annealing. In one embodiment, the thermal annealing is conducted at a temperature ranging from 400° C. to 850° C., for a time period ranging from 1 second to 300 seconds. In another embodiment, the thermal annealing is conducted at a temperature ranging from 300° C. to 500° C., for a time period ranging from 5 seconds to 30 seconds. The anneal process for the formation of the second metal semiconductor alloy 65a, 65b, 65c is dependent on the metal utilized. For example, when the second metal layer 60 is composed of platinum (Pt), and the first metal semiconductor alloy 20a, 20b, 20c is composed of nickel (Ni), a second metal semiconductor alloy 65a, 65b, 65c composed of nickel platinum (NiPt) may be formed by thermal annealing at a temperature ranging from −400° C. to 500° C., for a time period ranging from 5 seconds to 30 seconds.

By "convert" it meant that at least a portion of the metal elements from the second metal layer 60 and at least a portion of the metal and semiconductor elements from the first metal semiconductor alloy 20a present on the source region 40, the first metal semiconductor alloy 20b present on the drain region 45 and the first metal semiconductor alloy 20c present on the gate conductor 36 are intermixed or alloyed. In one embodiment, the intermixing or alloying of the metal elements and the semiconductor elements is provided by thermal diffusion. In one example, during thermal annealing, the deposited second metal layer 60 reacts with at least the silicon of the first metal semiconductor alloy 20a, 20b, 20c forming a second metal semiconductor alloy 65a, 65b, 65c composed of metal silicide.

The remaining portion of the second metal layer 60 that is not converted into the second metal semiconductor alloy 65a, 65b, 65c may be removed by a selective etch process. In one embodiment, the remaining portion of the second metal layer 60 is removed by an etch that is selective to the second metal semiconductor alloy 65a, 65b, 65c. The etch process may be a wet chemical etch, or a dry etch process, e.g. reactive ion etch (RIE). In one embodiment in which the second metal layer is composed of platinum (Pt) and the second metal semiconductor alloy 65a, 65b, 65c is composed of platinum silicide (PtSi), the etch process that removes the remaining portion of the second metal layer 60 is a wet etch composed of Aqua Regia or Sulfuric peroxide.

In one example, the second metal semiconductor alloy 65a, 65b, 65c may be composed of nickel silicide ($NiSi_x$). Other examples of compositions for the second metal semiconductor alloy 65a, 65b, 65c may include, nickel platinum silicide ($NiPt_ySi_x$), cobalt silicide ($CoSi_x$), tantalum silicide ($TaSi_x$), titanium silicide ($TiSi_x$) and combinations thereof. In one example, in which the second metal semiconductor alloy 65a, 65b, 65c is composed of nickel platinum silicide ($NiPt_ySi_x$), the silicon content may range from 40 wt. % to 60 wt. %, and the nickel (Ni) content ranges from 40 wt. % to 50 wt. %.

In one embodiment, the second metal semiconductor alloy 65a, 65b, 65c may have a thickness that is as great as 25 nm. In another embodiment, the second metal semiconductor alloy 65a, 65b, 65c may have a thickness of 2 nm to 20 nm. In yet another embodiment, the second metal semiconductor alloy 65a, 65b, 65c may have a thickness that ranges from 5 nm to 15 nm. In a further another embodiment, the second metal semiconductor alloy 65a, 65b, 65c may have a thickness that ranges from 7 nm to 12 nm. In yet a further embodiment, the second metal semiconductor alloy 65a, 65b, 65c has a thickness that ranges from 9 nm to 11 nm.

The remaining portion of the first metal semiconductor alloy 20a, 20b, 20c underlying the second metal semiconductor alloy 65a, 65b, 65c, which has not been converted into the second metal semiconductor alloy 65a, 65b, 65c, may have a thickness that ranges from 1 nm to 15 nm. In another embodiment, the remaining portion of the first metal semiconductor alloy 20a, 20b, 20c underlying the second metal semiconductor alloy 65a, 65b, 65c, which has not been converted into the second metal semiconductor alloy 65a, 65b, 65c, may have a thickness that ranges from 2 nm to 10 nm.

The second metal semiconductor alloy 65a, 65b, 65c increases the thickness of the metal semiconductor alloy underlying the void that is formed by recessing the upper surface of the first metal semiconductor alloy 20a, 20b, 20c with the etch process that forms the openings 15 for the later formed interconnects 55. The second metal semiconductor alloy 65a, 65b, 65c increases the thickness of the metal semiconductor alloy, i.e., first metal semiconductor alloy 20a, 20b, 20c, because the second metal semiconductor alloy 65a, 65b, 65c extends to a greater depth into the substrate 5 than the remaining portion of the first metal semiconductor alloy 20a, 20b, 20c. As noted above, the remaining portion of the first metal semiconductor alloy 20a, 20b, 20c has been thinned by the etch processes that form the openings 15 through the interlevel dielectric layer 11 and the dielectric layer 10.

In the embodiment depicted in FIG. 4, the upper surface of the second metal semiconductor alloy 65a, 65b, 65c is below and vertically offset from the upper surface of the portion of the first metal semiconductor alloy 20a, 20b, 20c that has not been recessed by the etch that forms openings 15 through the dielectric layer 10. The upper surface of the second metal semiconductor alloy 65a, 65b, 65c may occupy the same space as the upper surface of the first metal semiconductor alloy 20a, 20b, 20c that has been recessed by the etch process to form the openings 15. In one example, the upper surface of the second metal semiconductor alloy 65a, 65b, 65c is below and vertically offset from the upper surface of the portion of the first metal semiconductor alloy 20a, 20b, 20c that has not been recessed by a dimension ranging from 1 nm to 10 nm. In another example, the upper surface of the second metal semiconductor alloy 65a, 65b, 65c is below and vertically offset from the upper surface of the portion of the first metal semiconductor alloy 20a, 20b, 20c that has not been recessed by a dimension ranging from 5 nm to 10 nm. The second metal semiconductor alloy 65a, 65b, 65c extends to a depth within the substrate 5 and/or the gate conductor 36 by a dimension that is equal to the thickness of the second metal semiconductor alloy 65a, 65b, 65c. For example, when the second metal semiconductor alloy 65a, 65b, 65c has a thickness of 20 nm, the second metal semiconductor alloy extends to a depth of 20 nm into the substrate 5 and/or gate conductor 36 by a dimension equal to 20 nm, as measured from the upper surface of the second metal semiconductor alloy 65a, 65b, 65c.

In one embodiment, the first metal semiconductor alloy 20a, 20b, 20c and the second semiconductor alloy 65a, 65b, 65c provide contacts to the source region 40, drain region 45 and the gate conductor 36 of the gate structure 35. Although the contacts to the source region 40, drain region 45 and the gate conductor 36 are only depicted as being composed of the first and second metal semiconductor alloys 20a, 20b, 20c, 65a, 65b, 65c, it is noted that any number of metal semiconductor alloys may be employed to provide these contacts, e.g., third metal semiconductor alloy (not shown) on the second metal semiconductor alloy, and fourth metal semiconductor alloy (not shown) on the third metal semiconductor alloy, etc. For example, a third metal semiconductor alloy (not shown) may be formed atop the second metal semiconductor alloy by depositing a third metal layer atop the second metal semiconductor alloy 20a, 20b, 20c; converting at least a portion of the third metal layer and the second metal semiconductor alloy into a third metal semiconductor alloy using a thermal anneal; and removing the remaining portion of the third metal layer that is not reacted into the third metal semiconductor alloy with a selective etch. The details of the process sequence for forming the third metal semiconductor alloy are similar to the process sequence for forming the second metal semiconductor alloy 65a, 65b, 65c that are described above with reference to FIGS. 3 and 4.

Still referring to FIG. 4, interconnects 55 may then be formed in the openings 15, in which the interconnects 55 are in direct contact with the upper surface of the second metal semiconductor alloy 65a, 65b, 65c. The interconnects 55 may be composed of any electrically conductive material. "Electrically conductive" as used through the present disclosure means a material typically having a room temperature conductivity of greater than $10^{-8}$ $(\Omega\text{-m})^{-1}$. Examples of materials that are suitable for the interconnect 55 include metals and doped semiconductors. For example, in one embodiment, the interconnect 55 may be composed of tungsten (W). Other metals that are suitable for the interconnect 55 include, but are not limited to, copper (Cu), titanium (Ti), tantalum (Ta), ruthenium (Ru) nickel (Ni), cobalt (Co), silver (Ag), aluminum (Al), platinum (Pt), gold (Au) and alloys thereof.

The interconnects 55 are formed by depositing a conductive metal into the openings 15 to using a deposition process, such as physical vapor deposition (PVD). Examples of physical vapor deposition (PVD) that are suitable for forming the interconnect 55 include sputtering and plating.

Examples of sputtering apparatuses suitable for forming the interconnect 55 include DC diode type systems, radio frequency (RF) sputtering, magnetron sputtering, and ionized metal plasma (IMP) sputtering. The interconnect 55 may also be formed using chemical vapor deposition (CVD) and atomic layer deposition (ALD) or a combination of the two. The interconnect 55 may be composed of a conductive metal, such as tungsten, copper, aluminum, silver, gold, ruthenium, cobalt and alloys thereof. In some embodiments, a Ti/TiN liner may be formed on the sidewalls and the base of the opening 15 to the second metal semiconductor alloy 65a, 65b that is present on the source and the drain regions 40, 45 prior to depositing a tungsten fill to form the interconnects 55.

FIGS. 5-9 depict another embodiment of the present disclosure, in which the metal semiconductor alloy contacts to the source and drain regions 140, 145 of a semiconductor device 200 are formed after the dielectric layer 101, e.g., stress inducing dielectric layer, has been formed over the source and drain regions 140, 145. In this embodiment, because the metal semiconductor alloy contacts are formed after the dielectric layer 101, there is no erosion of the metal semiconductor alloy contacts by the etch process that forms the openings 115 for the subsequently formed interconnects 155 to the source and drain regions 140, 145.

Figure 5:
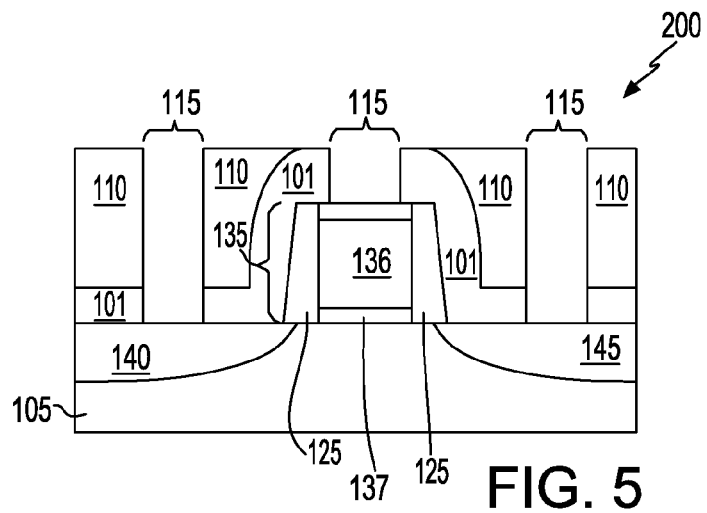
FIG. 5 is a side cross-sectional view of one embodiment of forming a dielectric layer over at least the source region and the drain region of a semiconductor device, and forming an opening in the dielectric layer to expose surfaces of the source region, drain region and gate, in accordance with one embodiment of the present disclosure.

Referring to FIG. 5, in this embodiment, the dielectric layer 101 is formed over the semiconductor device 200 including the gate structure 135, the source region 140 and the drain regions 145 before a metal semiconductor alloy contact region is formed on the upper surface of at least the source region 140 and the drain region 145. The source region 140, drain region 145 and gate structure 135 (including the gate conductor 136, gate dielectric 137 and at least one dielectric spacer 125) that are depicted in FIG. 5 are similar to the source region 40, drain region 45 and gate structure 35 that are depicted in FIG. 1. Therefore, the above description of the source region 40, drain region 45 and gate structure 35 with reference to FIG. 1 is equally applicable to the source region 140, the drain region 145 and the gate structure 135 that are depicted in FIG. 5.

Referring to FIG. 5, a dielectric layer 101 is formed over the source region 140, the drain region 135 and the gate structure 135. Similar to the dielectric layer 10 that is described above with reference to FIG. 2, the dielectric layer 101 may be composed of a tensile stress inducing material or a compressive stress inducing material. The dielectric layer 101 that is depicted in FIG. 5 is similar to the dielectric layer 10 that is described above with reference to FIG. 2, with the exception that the dielectric layer 101 is not formed over a metal semiconductor alloy surface. Therefore, the details regarding the composition and method of forming the dielectric layer 10 that is described above with reference to FIG. 2, is equally applicable to the dielectric layer 101 that is depicted in FIG. 5. The interlevel dielectric layer 110 that is depicted in FIG. 5 is similar to the interlevel dielectric layer 11 that is described above with reference to FIG. 2. Therefore, the details regarding the composition and method of forming the interlevel dielectric layer 11 that is described above with reference to FIG. 2, is equally applicable to the interlevel dielectric layer 110 that is depicted in FIG. 5.

Openings 115 are formed in the interlevel dielectric layer 110 and the dielectric layer 101 to expose a portion of the substrate 5 including the source region 140 and drain region 145, and optionally to expose a portion of the upper surface of the gate conductor 136 of the gate structure 135. The openings 115 that are depicted in FIG. 5 are similar to the openings 15 that are described above with reference to FIG. 2, with the exception that the openings 115 depicted in FIG. 5 are formed by an etch that terminates on a surface of the substrate 105 that does not include a metal semiconductor alloy. Therefore, the details regarding the dimensions and method of forming the openings 15 that is described above with reference to FIG. 2, are equally applicable to the openings 115 that are depicted in FIG. 5. In one example, when the dielectric layer 101 is composed of silicon nitride, and the upper surface of the source and drain regions 140, 145 are composed of silicon, the etch chemistry for forming the openings 115 to the source region 140 and drain region 145 is composed of fluorine based chemical, such as $CF_4$, $CClF_2$, $SF_6$ and combinations thereof.

Figure 6:
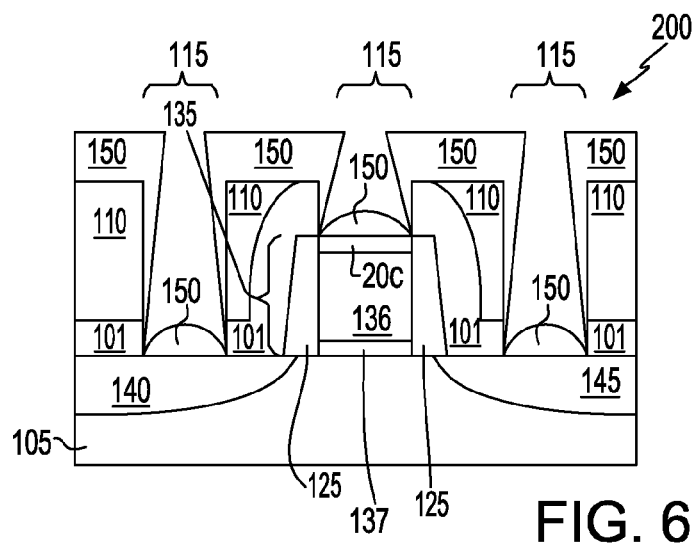
FIG. 6 is a side cross-sectional view depicting depositing a first metal layer on the exposed surfaces of the source region, a drain region and gate, in accordance with the present disclosure.

FIG. 6 depicts one embodiment of depositing a first metal layer 150 on the exposed surface of the substrate 105 that includes the source region 140 and the drain region 145. The first metal layer 150 may be deposited on the gate conductor 136 of the gate structure 135, in the embodiments in which an opening 115 is formed exposing the upper surface of the gate conductor 136. The first metal layer 150 may be formed using a physical vapor deposition (PVD) process, such as plating, e.g., electroplating or electroless deposition, sputtering or chemical vapor deposition (CVD). Examples of sputtering apparatus that may be suitable for depositing the first metal layer 150 include DC diode type systems, radio frequency (RF) sputtering, magnetron sputtering, and ionized metal plasma (IMP) sputtering. In one embodiment, the first metal layer 150 is deposited to a thickness ranging from 2 nm to 10 nm. In another embodiment, the first metal layer 150 is deposited to a thickness ranging from 2 nm to 5 nm. The first metal layer 150 that is deposited may include Ta, Ti, W, Pt, Co, Ni, and combinations thereof.

Figure 7:
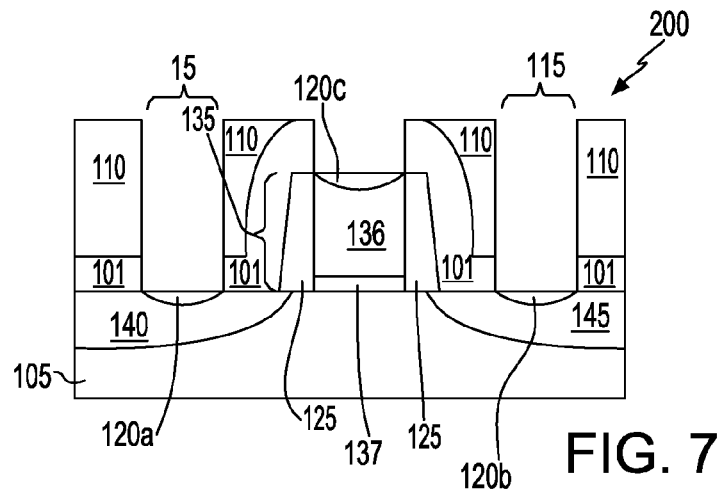
FIG. 7 is a side cross-sectional view depicting applying a first anneal to convert at least a first portion of the first metal layer into a first metal semiconductor alloy, and removing a remaining portion of the first metal layer that is not converted into the first metal semiconductor alloy, in accordance with one embodiment of the present disclosure.

In one embodiment, following deposition of the first metal layer 150, the structure is subjected to an annealing step, such as rapid thermal annealing, furnace annealing or laser annealing, to convert at least a portion of the first metal layer 150 and the upper surface of the semiconductor substrate 105 that is in direct contact with the first metal layer 150 into a first metal semiconductor alloy 120a, 120b, 120c, as depicted in FIG. 7. In one embodiment, the thermal annealing is conducted at a temperature ranging from 400° C. to 850° C., for a time period ranging from 1 second to 300 seconds. In another embodiment, the thermal annealing is conducted at a temperature ranging from 400° C. to 500° C., for a time period ranging from 5 seconds to 30 seconds. Similar to the anneal processes used to form the first metal semiconductor alloy 20a, 20b, 20c, depicted in FIG. 1, and the second semiconductor metal alloy 65a, 65b, 65c depicted in FIG. 4, the anneal process for the formation of the first metal semiconductor alloy 120a, 120b, 120c depicted in FIG. 7 may be dependent on the metal utilized. By "convert" it meant that at least a portion of the metal elements from the first metal layer 150 and at least a portion of the semiconductor elements from the source region 140, the drain region 145 and/or the gate conductor 136 are intermixed or alloyed. The remaining portion of the first metal layer 150 that is not converted into the first metal semiconductor alloy 120a, 120b, 120c may be removed by a selective etch process that is similar to the etch used to remove the unreacted portions of the first metal layer that forms the first metal semiconductor alloy 20a, 20b, 20c, which is described above with reference to FIG. 1.

Referring to FIG. 7 and in one example, the first metal semiconductor alloy 120a, 120b, 120c may be composed of nickel silicide ($NiSi_x$). Other examples of compositions for the first metal semiconductor alloy 120a, 120b, 120c may include, nickel platinum silicide ($NiPt_ySi_x$), cobalt silicide (CoSi$_x$), tantalum silicide (TaSi$_x$), titanium silicide (TiSi$_x$), tungsten silicide (WSi$_x$) and combinations thereof. In one example, in which the first metal semiconductor alloy 120a, 120b, 120c is composed of nickel silicide (NiSi), the silicon content may range from 40 wt. % to 60 wt. %, and the nickel (Ni) content ranges from 40 wt. % to 60 wt. %.

The first metal semiconductor alloy 120a, 120b, 120c may have a thickness of 3 nm to 20 nm. In another embodiment, the first metal semiconductor alloy 120a, 120b, 120c may have a thickness that ranges from 5 nm to 15 nm. Different from the first metal semiconductor alloy 20a, 20b that is depicted in FIG. 1, which extends to the sidewall of the gate structure 35, the first metal semiconductor alloy 120a, 120b that is depicted in FIG. 7 is contained within the openings 115 to the source region 140 and the drain region 145, and is therefore separated from the gate structure 135. The inner edge of the first metal semiconductor alloy 120a, 120b is separated from the sidewall of the gate structure 36 by a dimension ranging from 10 nm to 50 nm. In another embodiment, the inner edge of the first metal semiconductor alloy 120a, 120b is separated from the sidewall of the gate structure 36 by a dimension ranging from 15 nm to 25 nm.

Figure 8:
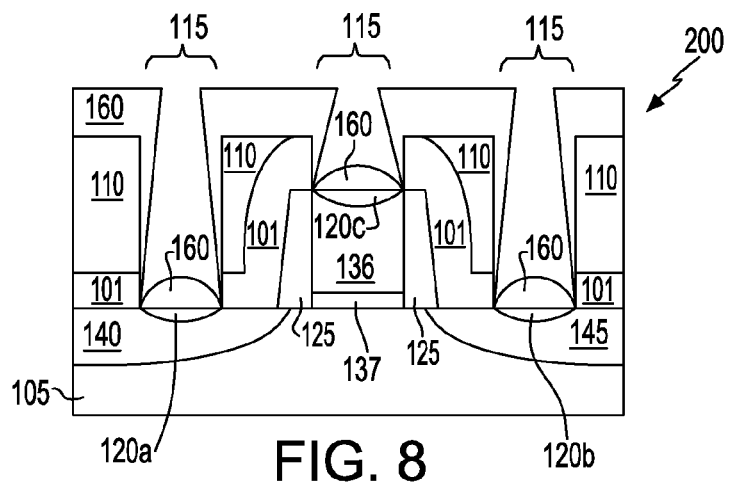
FIG. 8 is a side cross-sectional view depicting depositing a second metal layer on the exposed surface of the first metal semiconductor alloy, in accordance with one embodiment of the present disclosure.

FIG. 8 depicts one embodiment depositing a second metal layer 160 on the exposed surface of the first metal semiconductor alloy 120a, 120b, 120c. The second metal layer 160 that is depicted in FIG. 8 is similar to the second metal layer 60 that is described above with reference to FIG. 3. Therefore, the details regarding the composition and method of forming the second metal layer 60 that is described above with reference to FIG. 3, is equally applicable to the second metal layer 160 that is depicted in FIG. 8.

Figure 9:
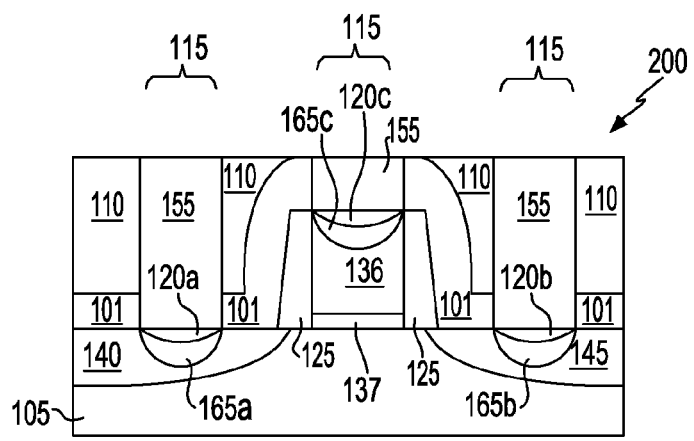
FIG. 9 is a side cross-sectional view depicting applying a second anneal to convert at least a portion of the second metal layer and the first metal semiconductor alloy into the second metal semiconductor alloy, in accordance with one embodiment of the present disclosure.

FIG. 9 depicts one embodiment of applying a second anneal to convert at least a portion of the second metal layer 160 and the first metal semiconductor alloy 120a, 120b, 120c into a second metal semiconductor alloy 165a, 165b, 165c. By "convert" it meant that at least a portion of the metal elements from the second metal layer 160 and at least a portion of the metal and semiconductor elements from the first metal semiconductor alloy 120a present on the source region 140, the first metal semiconductor alloy 120b present on the drain region 145 and the first metal semiconductor alloy 120c present on the gate conductor 136 are intermixed or alloyed.

In one embodiment, the structure is subjected to an annealing step, such as rapid thermal annealing, furnace annealing or laser annealing, to convert at least a portion of the second metal layer 160 and the upper surface of the first metal semiconductor alloy 120a, 120b, 120c that is in direct contact with the second metal layer 160 into a second metal semiconductor alloy 165a, 165b, 165c. In one embodiment, the thermal annealing is conducted at a temperature ranging from 400° C. to 850° C., for a time period ranging from 1 second to 300 seconds. In another embodiment, the thermal annealing is conducted at a temperature ranging from 400° C. to 500° C., for a time period ranging from 5 seconds to 30 seconds. The remaining portion of the second metal layer 160 that is not converted into the second metal semiconductor alloy 165a, 165b, 165c may be removed by a selective etch process that is similar to the etch used to remove the unreacted portions of the second metal layer that forms the second metal semiconductor alloy 65a, 65b, 65c, which is described above with reference to FIG. 4.

In one example, the second metal semiconductor alloy 165a, 165b, 165c may be composed of nickel silicide (NiSi$_x$). Other examples of compositions for the second metal semiconductor alloy 165a, 165b, 165c may include, nickel platinum silicide (NiPt$_y$Si$_x$), cobalt silicide (CoSi$_x$), tantalum silicide (TaSi$_x$), titanium silicide (TiSi$_x$), tungsten silicide (WSix) and combinations thereof. In one example, in which the second metal semiconductor alloy 165a, 165b, 165c is composed of nickel platinum silicide (NiPt$_y$Si$_x$), the silicon content may range from 40 wt. % to 60 wt. %, and the nickel (Ni) content ranges from 40 wt. % to 60 wt. %.

The second metal semiconductor alloy 165a, 165b, 165c may have a thickness of 5 nm to 20 nm. In another embodiment, the second metal semiconductor alloy 165a, 165b, 165c may have a thickness that ranges from 8 nm to 12 nm. The remaining portion of the first metal semiconductor alloy 120a, 120b, 120c underlying the second metal semiconductor alloy 165a, 165b, 165c, which has not been converted into the second metal semiconductor alloy 165a, 165b, 165c, may have a thickness that ranges from 5 nm to 20 nm. In another embodiment, the remaining portion of the first metal semiconductor alloy 120a, 120b, 120c underlying the second metal semiconductor alloy 165a, 165b, 165c, which has not been converted into the second metal semiconductor alloy 165a, 165b, 165c, may have a thickness that ranges from 10 nm to 15 nm.

In one embodiment, the first metal semiconductor alloy 120a, 120b, 120c and the second semiconductor alloy 165a, 165b, 165c provide contacts to the source region 140, drain region 145 and the gate conductor 136 of the gate structure 135, as depicted in FIG. 9. Although the contacts to the source region 140, drain region 145 and the gate conductor 136 are only depicted as being composed of the first and second metal semiconductor alloys 120a, 120b, 120c, 165a, 165b, 165c, it is noted that any number of metal semiconductor alloys may be employed to provide these contacts, e.g., third metal semiconductor alloy (not shown) on the second metal semiconductor alloy, and fourth metal semiconductor alloy (not shown) on the third metal semiconductor alloy, etc. The details of the process sequence for forming the third metal semiconductor alloy and subsequently formed metal semiconductor alloys are similar to the process sequence for forming the second metal semiconductor alloy 65a, 65b, 65c that is described above with reference to FIGS. 3 and 4.

Still referring to FIG. 9, interconnects 155 may then be formed in the openings 115, in which the interconnects 155 are in direct contact with the upper surface of the second metal semiconductor alloy 165a, 165b, 165c. The interconnects 155 that are depicted in FIG. 9 are similar to the interconnects 55 that is described above with reference to FIG. 4. Therefore, the details regarding the composition and method of forming the interconnects 55 that is described above with reference to FIG. 4, is equally applicable to the interconnects 155 that are depicted in FIG. 9.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:
1. A semiconductor device comprising:
   a gate structure on a channel region of a substrate, wherein a source region and a drain region are on opposing sides of said channel region of said substrate;
   a first metal semiconductor alloy present on an upper surface of at least one of said source region and said drain region, wherein said first metal semiconductor alloy extends to a sidewall of said gate structure;

a dielectric layer over said gate structure and said first metal semiconductor alloy, wherein an opening is present through said dielectric layer to a portion of said first metal semiconductor alloy that is separated from said gate structure; and a second metal semiconductor alloy that is present in said opening and in direct contact with said first metal semiconductor alloy, wherein said second metal semiconductor alloy has an upper surface that is vertically offset and located below said upper surface of said first metal semiconductor alloy, and wherein said second metal semiconductor alloy has outer edges that are vertically coincident to sidewall surfaces of said opening.

2. The semiconductor device of claim 1, wherein said dielectric layer induces a compressive stress on said channel region.

3. The semiconductor device of claim 1, wherein said dielectric layer induces a tensile stress on said channel region.

4. The semiconductor device of claim 1, wherein a first portion of said first metal semiconductor alloy that is present underlying said opening in said dielectric layer has a thickness ranging from 5 nm to 10 nm, and a second portion of said first metal semiconductor alloy that is not present underlying said opening in said dielectric layer has a thickness ranging from 5 nm to 15 nm.

5. The semiconductor device of claim 4, wherein said second metal semiconductor alloy has a thickness as great as 25 nm.

6. The semiconductor device of claim 1, wherein said gate structure includes dielectric spacers located on sidewall surfaces of a gate stack comprising, from bottom to top, a gate dielectric and a gate conductor, and wherein said first metal semiconductor alloy extends to an outermost sidewall of said dielectric spacer.

7. The semiconductor device of claim 1, wherein said first metal semiconductor alloy includes a metal selected from Ni, W, Pt, Co, Ta, Ti and combinations thereof.

8. The semiconductor device of claim 7, wherein said first metal semiconductor alloy is a silicide of at least one of said metals.

9. The semiconductor device of claim 7, wherein said first metal semiconductor alloy is a germane-silicide of at least one of said metals.

10. The semiconductor device of claim 1, further comprising an interlevel dielectric layer located above said dielectric layer, said interlevel dielectric layer having an entirely planar topmost surface which is located above a topmost surface of said gate structure.

11. The semiconductor device of claim 1, wherein said second metal semiconductor alloy has outermost sidewalls that are aligned to sidewalls of said opening.

12. The semiconductor device of claim 1, wherein said first metal semiconductor alloy comprises a metal silicide.

13. The semiconductor device of claim 1, wherein said first metal semiconductor alloy comprises a metal germanosilicide.

14. The semiconductor device of claim 1, wherein said second metal semiconductor alloy has a same composition as said first metal semiconductor alloy.

15. The semiconductor device of claim 1, wherein said second metal semiconductor alloy has a different composition than said first metal semiconductor alloy.

16. The semiconductor device of claim 1, wherein said second metal semiconductor alloy comprises a metal silicide.

17. The semiconductor device of claim 1, wherein said second metal semiconductor alloy comprises a metal germano-silicide.

18. The semiconductor device of claim 1, wherein a topmost surface of said first metal semiconductor alloy is coplanar with a topmost surface of said second metal semiconductor alloy.

19. The semiconductor device of claim 18, wherein a bottommost surface of said second metal semiconductor alloy has a depth that is deeper than a bottommost surface of said first metal semiconductor alloy.

* * * * *